(12) United States Patent
Regnier et al.

(10) Patent No.: US 6,236,566 B1
(45) Date of Patent: May 22, 2001

(54) COOLING ELEMENT FOR A POWER ELECTRONIC DEVICE AND POWER ELECTRONIC DEVICE COMPRISING SAME

(75) Inventors: Bernard Regnier, Aix les Bains; Jacques Cettour-Rose, Ordizan; Patrick Luscher, Heyrieux; Daniel Fellmann, Ibos, all of (FR)

(73) Assignee: Alstom Transport SA, Paris (FR)

( * ) Notice: Subject to any disclaimer, the term of this patent is extended or adjusted under 35 U.S.C. 154(b) by 0 days.

(21) Appl. No.: 09/622,672
(22) PCT Filed: Feb. 22, 1999
(86) PCT No.: PCT/FR99/00394
§ 371 Date: Oct. 5, 2000
§ 102(e) Date: Oct. 5, 2000
(87) PCT Pub. No.: WO99/43190
PCT Pub. Date: Aug. 26, 1999

(30) Foreign Application Priority Data

Feb. 23, 1998 (FR) .................................................. 98 02142

(51) Int. Cl.⁷ .................................................. H05K 7/20
(52) U.S. Cl. .................... 361/699; 361/689; 361/698; 361/704; 361/707; 174/15.1; 257/714; 165/80.4
(58) Field of Search ...................................... 361/688–690, 361/696–704, 707, 712, 715, 716, 719–721; 257/714, 726, 727, 718, 719; 174/15.1, 15.2, 16.1, 16.3; 165/80.2–80.4, 104.33, 104.34, 185

(56) References Cited

U.S. PATENT DOCUMENTS

| | | | |
|---|---|---|---|
| 2,942,165 | * 6/1960 | Jackson et al. | 257/714 |
| 3,652,903 | * 3/1972 | Eriksson et al. | 257/714 |
| 5,132,777 | * 7/1992 | Kloucek | 257/714 |
| 5,349,498 | * 9/1994 | Tanzer et al. | 361/689 |
| 5,453,911 | * 9/1995 | Wolgemuth et al. | 361/689 |
| 6,084,771 | * 7/2000 | Ranchy et al. | 361/699 |

* cited by examiner

Primary Examiner—Leo P. Picard
Assistant Examiner—Boris L. Chervinsky
(74) Attorney, Agent, or Firm—Sughrue, Mion, Zinn, Macpeak & Seas, PLLC

(57) ABSTRACT

A cooling element (2) for power electronic devices comprises heat-exchange fluid inlet and outlet apparatus (29) and an interior volume in which said fluid circulates. The element (2) is made from an electrically insulative material and comprises at least one opening (28) connecting the internal volume (V) to the exterior of the element, a perimeter (24) of the at least one opening (28) forming a seat receiving at least one base (38A) of the power electronic device (36) to be cooled with sealing apparatus (43) between them. The element has a small volume compared to those of the prior art.

12 Claims, 4 Drawing Sheets

COOLING ELEMENT FOR A POWER ELECTRONIC DEVICE AND POWER ELECTRONIC DEVICE COMPRISING SAME

BACKGROUND OF THE INVENTION

The present invention relates to a cooling element for power electronic components.

Such cooling elements are usually made of metal, in particular of aluminum or copper, and comprise a volume in which a heat-exchange fluid circulates and whose two ends respectively constitute a fluid inlet and a fluid outlet. The walls defining the circulation volume can be provided with fins cooled by a natural or forced flow of air. The circulation volume can equally be fed with water or any other cooling liquid.

Power electronic modules are fixed to the metal cooling element, for example bolted to it. Other units enabling the electronic power component to operate correctly are also attached, for example starters, capacitors and one or more phase bars in the case of a phase inverter.

The cooling elements referred to above have a number of drawbacks, however. Most of the component parts of the power component must be electrically insulated from one another, leading to the use of complex mechanical assemblies. In the case of an inverter phase, insulating parts are used to fix the capacitors, starters, and phase bars, for example. The metal cooling element must also be kept away from live components.

The use of these mechanical assemblies therefore makes the whole of the power electronic component very complex, which contributes to increasing its cost. The overall volume and the weight of such power components are also relatively high.

The invention proposes to provide a cooling element which can alleviate the drawbacks of the prior art referred to above. To this end, it provides a cooling element for power electronic devices, in particular for phases inverter, the element comprising heat-exchange fluid inlet and outlet means and an interior volume in which the fluid circulates, characterized in that the cooling element is made from an electrically insulative material and comprises at least one opening connecting the internal volume to the exterior of the element, a perimeter of the at least one opening forming a seat receiving at least one base of the power electronic device to be cooled with sealing means between them.

According to other features of the invention:

the cooling element is made from a material that can be molded;

the cooling element comprises two identical half-bodies assembled together;

the cooling element includes a number of openings corresponding to the number of bases received on the element;

the intermediate space between two openings which are adjacent in the fluid flow direction includes at least two passages extending in the fluid flow direction and separated by at least one rib on the cooling element; and the longitudinal axis of the rib is inclined to the fluid flow direction.

The invention also provides a power electronic device, in particular a phase inverter, comprising a cooling element, a plurality of power modules fixed to the cooling element and complementary functions of the device, in particular starters, characterized in that the cooling element is a cooling element as described hereinabove.

According to other features of the invention:

each base received on the perimeter of the at least one opening is integral with one of the power modules;

the base has fins extending in the fluid flow direction;

the modules are fixed in pairs at corresponding openings disposed symmetrically with respect to the median plane of the cooling element and an insert is immobilized between the adjacent ends of the facing modules of each pair, or the end of a first module extends towards a second module facing it at or beyond the end of the latter;

the power modules are fixed to the cooling element by a clamp on their face opposite the interior fluid circulation volume;

the clamp is electrically conductive and is common to two power modules which are adjacent in the fluid flow direction;

the cooling element comprises two half-bodies assembled together and the clamp member is fixed to the cooling element by fixing means which also fasten the two half-bodies together; and the base comprises at least one plate attached at least one of the openings of the cooling element.

BRIEF DESCRIPTION OF THE DRAWINGS

The invention is described below with reference to the accompanying drawings, which are given by way of non-limiting example only and in which.

DETAILED DESCRIPTION OF THE INVENTION

Figure 1:
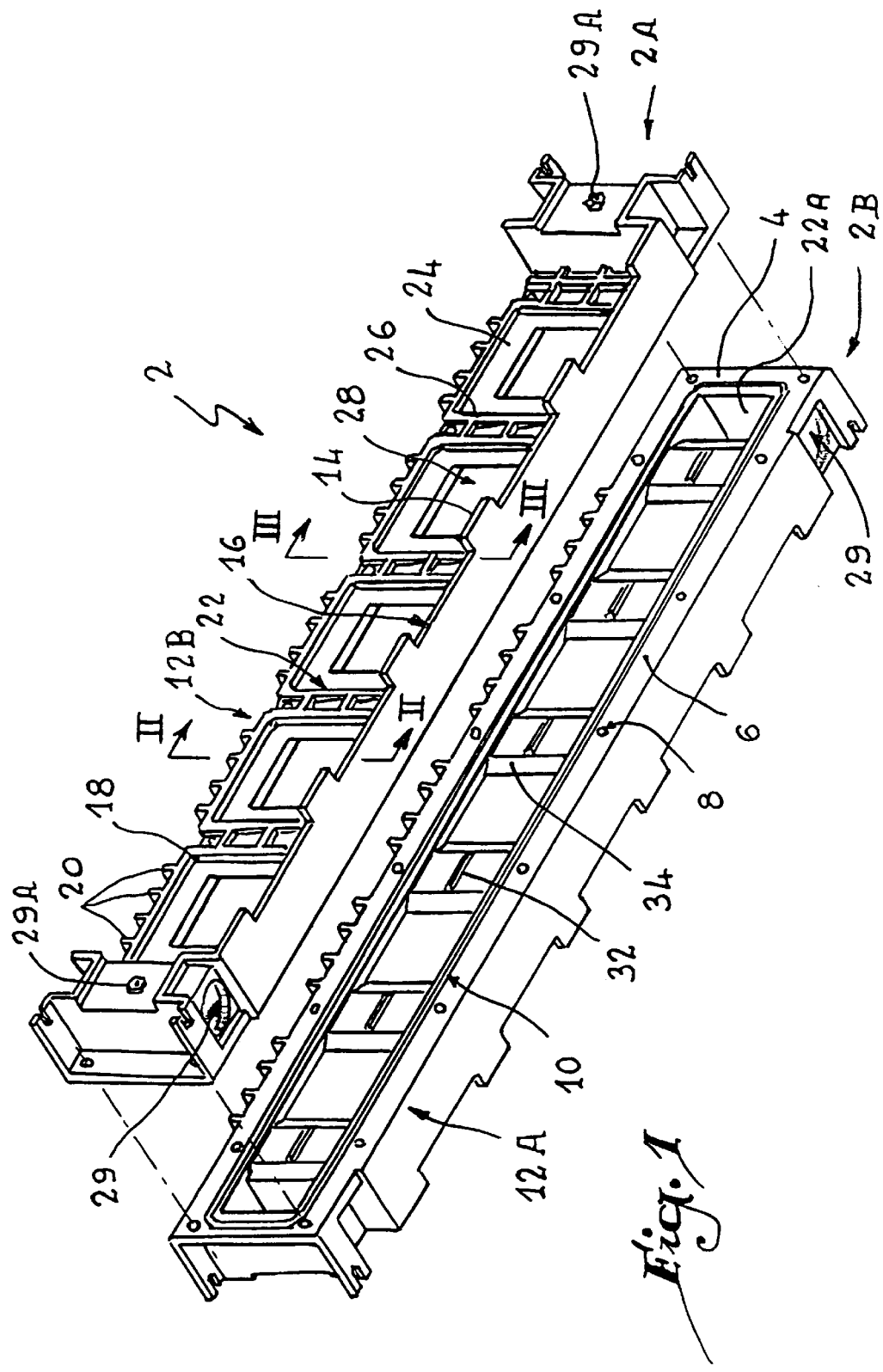
FIG. 1 is a perspective view of two half-bodies for constructing a cooling element according to the invention before the two half-bodies are assembled together.
Figure 3:
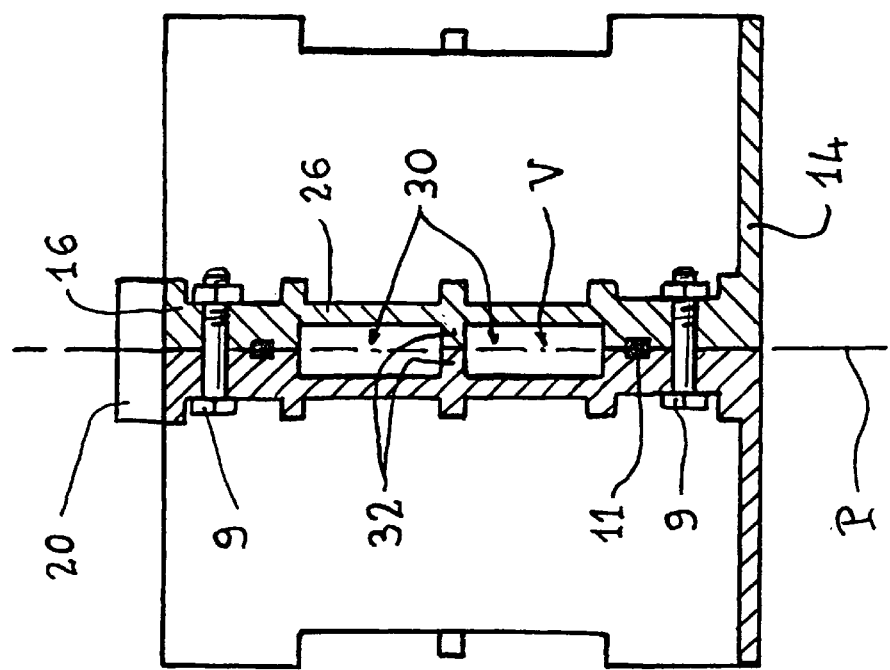
FIGS. 2 and 3 are views of the assembled cooling element in section respectively taken along the lines II—II and III—III in FIG. 1.
Figure 2:
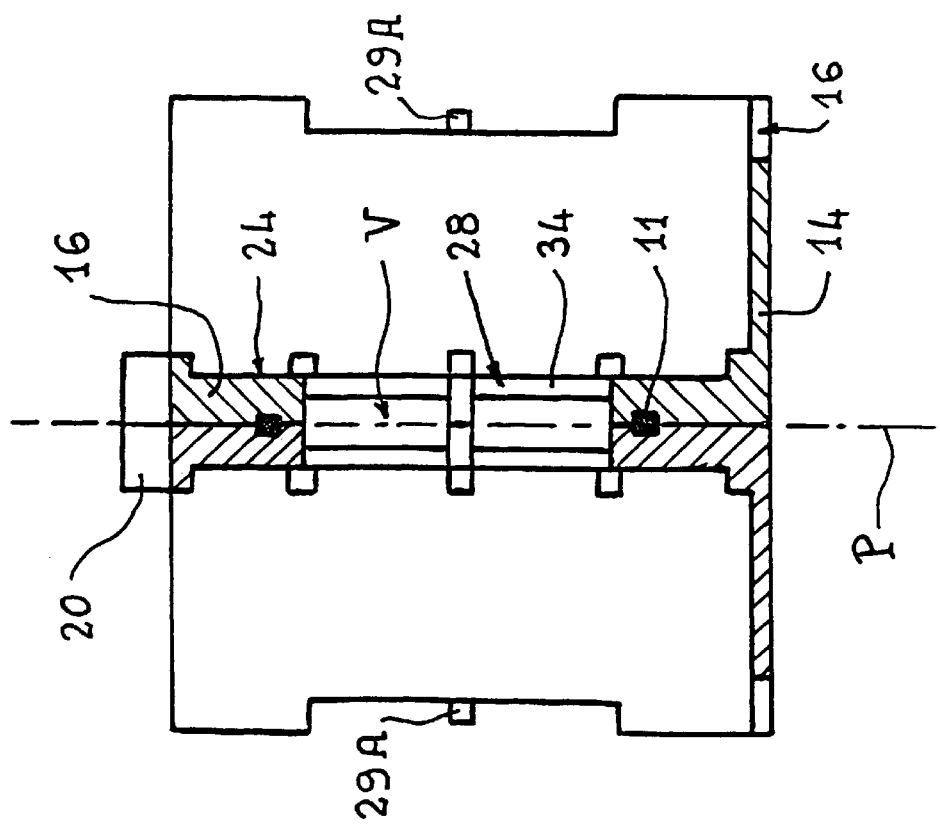

Referring to FIGS. 1 to 3, the cooling element according to the invention consists of two half-bodies 2A and 2B made from an electrically insulative material that can be molded, for example a polyphenylene oxide (PPO) resin which can be injection molded. The half-bodies are substantially identical.

Each elongate half-body 2A, 2B has a back 4 which is hollowed out over the greater part of its surface to define a peripheral strip 6 which surrounds the hollowed out part. The strip 6 incorporates several holes 8 for screws 9 for fastening the two half-bodies together, as shown in FIG. 3. The strip 6A also has a peripheral groove 10 adapted to receive a seal 11 which can be seen in FIGS. 2 and 3.

The cavities formed in the respective backs of the two facing half-bodies define within the assembled cooling element 2 a volume V in which a heat-exchange fluid circulates, as can be seen in FIGS. 2 and 3 in particular.

Two lateral walls 12A and 12B extend from the peripheral strip 6. The wall 12A has a continuous longitudinal rim 14 provided with a succession of notches 16 through which control connections of the assembled phase inverter pass. The other lateral wall 12B has a discontinuous border 18 from which extend a multiplicity of transverse projections 20 adapted to house spacers for connecting power modules of the assembled inverter phase.

The lateral walls 12A, 12B of each half-body are joined together at a face 22 opposite the back 4. The face 22 includes a series of lands 24 along the main axis of each half-body 2A, 2B and between the rim 14 of the lateral wall 12A and the border 18 of the lateral wall 12B. Two consecutive lands are separated by partitions 26 onto which the screw holes 8 open. An opening 28 adapted to receive a power module is formed at the center of each land 24. The openings 28 connect the circulation volume V to the exterior of the cooling element 2.

At each longitudinal end of each half-body 2A, 2B, the face 22 opposite the back 4 forms a setback 22A so that the assembled cooling element 2 has heat-exchange fluid inlet and outlet spaces at respective opposite ends. Those spaces are connected to the exterior of the cooling element by respective orifices 29 adapted to be connected to respective fluid inlet and outlet lines. Fins 29A project outward from each end of the wall 22 and are used to fix a phase bar, as explained below.

As shown in FIG. 3, the circulation volume V defined by the facing partitions 26 and the lateral walls 12 does not communicate with the outside of the cooling element in the intermediate space between two successive openings. The volume V is formed by two passages 30 extending in the fluid flow direction. The passages are separated from each other by ribs 32 projecting from the partitions 26 towards the back 4. The ribs 32 are in mutual contact in the assembled cooling element, which imparts satisfactory mechanical strength to the cooling element 2.

The longitudinal axis of each rib can be inclined to the fluid flow direction. This procures an agitated flow of fluid between two successive openings 28, which has the advantage of mixing streams of water at different temperatures. This is particularly important if the ribs 32 are not in mutual contact, enabling the fluid to pass from one passage to the other. The axial end of each passage is connected to the adjacent land 24 via an inclined plane 34 which can be seen in FIGS. 1 and 2 and is inclined away from the base 4 and towards each opening 28.

In the example shown, the two half-bodies 2A, 2B are fixed together by means of screws and a seal. Other fixing means can be used, such as gluing, elastic clipping or ultrasound welding.

Figure 4:
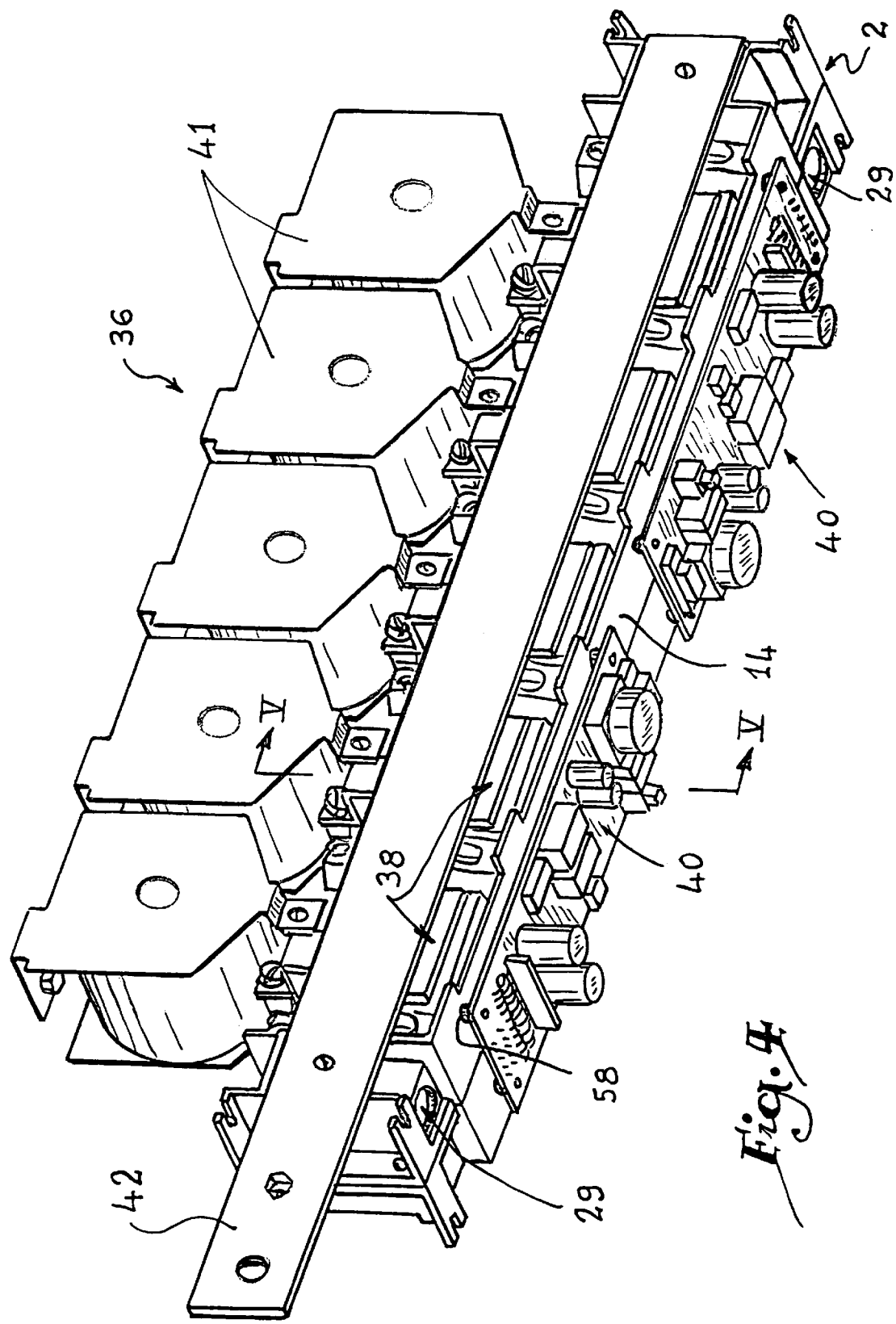
FIG. 4 is a perspective view of an inverter phase constructed on the assembled cooling element shown in FIG. 1.

FIG. 4 shows a phase inverter 36 based on the assembled cooling element shown in FIGS. 1 to 3. The phase inverter 36 comprises power modules 38 attached to the cooling element 2 at each opening 28. The cooling element also carries starters 40, capacitors 41 and a phase bar 42.

Figure 5:
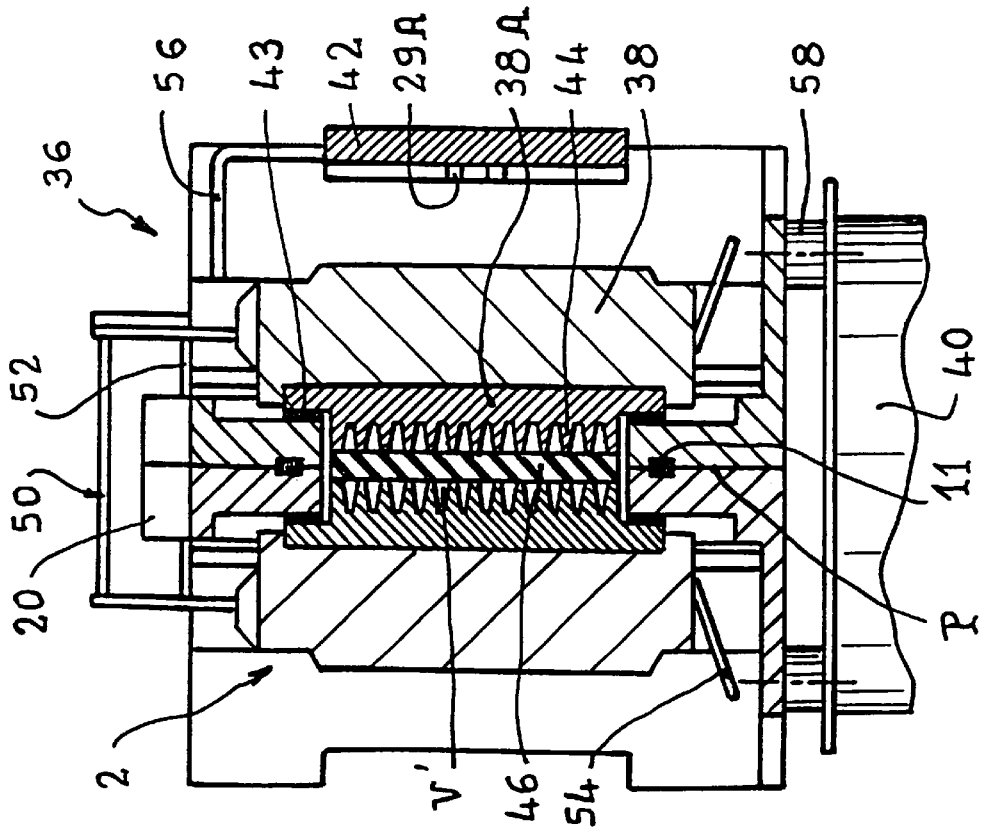
FIG. 5 is a view in section taken along the line V—V in FIG. 4.

To be more precise, and referring to FIG. 5 in particular, each power module 38 is an insulated gate bipolar transistor (IGBT), for example, and has a base 38A which is made of copper, for example. The base bears on the inside perimeter of one of the lands 24, with a seal 43 between them. Sealing means can equally be formed by an intimate co-operation of shapes between the module and the opening which receives it, for example by molding the material of the cooling element around the module.

The end of the base 38A opposite the module body 38 has fins 44 which penetrate into the circulation volume V through each opening 28. Two identical power modules face each other across a median plane (P) of the cooling element. Thus each land 24 forms a seat for receiving the base 38A of a corresponding power module 38.

An insert 46 made from foam or silicone, for example, is immobilized between the adjacent ends of the fins 44 of each power module 38. This prevents an unwanted flow of water around the fins 44, which optimizes the exchange of heat via the fins. The heat-exchange fluid is constrained to flow in interstitial volumes V' formed between each pair of adjacent fins of the same power module.

Figure 6:
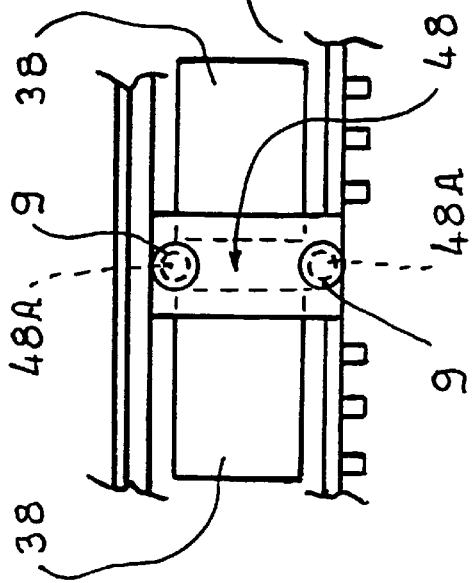
FIG. 6 is a partial sectional view to a larger scale, analogous to that of FIG. 5, showing a variant of the fins of a power module of the inverter phase shown in FIG. 4.

As shown in FIG. 6, the fins 144 of a first power module 138 can equally extend beyond the ends of the fins 144' of the facing module 138'. This also guarantees the maximum exchange of heat.

Figure 7:
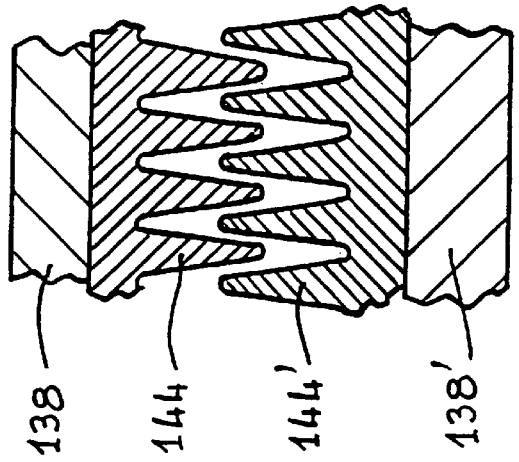
FIG. 7 is a diagrammatic partial top view showing the mounting of two successive power modules equipping the inverter phase shown in FIG. 4.

FIG. 7 shows the fixing of the power modules 38 to the cooling element 2. Two successive modules 38 are fixed to the same half-body 2A by a single clamp 48 covering the facing ends of the two modules. The clamp 48 is made from an electrically conductive material and is fixed to the half-body 2A by screws 9 which also fasten the two half-bodies together. The screws 9 enter holes 48A in the clamp in line with the holes 8 in each half-body 2A, 2B.

Referring again to FIG. 5, the two facing power modules 38 are electrically connected by means of conductive members 50 which are braced by spacers 52 bearing on the projections 20 on each border 18. The control connections of the power modules are twisted wires which connect to conductive members 54, for example.

The phase bar 42 is fixed to the cooling element 2 by pins 29A on the cooling element which enter corresponding orifices in the phase bar. The phase bar is electrically connected to one or more power modules 38 by a conductive member 56.

The starters 40 are attached to the cooling element 2 at the borders 18 of each half-body 2A, 2B. They are fixed by bosses 58 integral with the cooling element.

The invention achieves the objectives previously stated. The insulative material cooling element with openings to receive power modules has a three-fold function of mechanical support, cooling and electrical insulation.

Assemblies which have to be insulated from each other can therefore be assembled to the cooling element without using the complex mechanical assemblies known in the art.

The cooling element of the invention is therefore of much simpler design and has a much smaller volume than prior art cooling elements, and the estimated reduction is from 30% to 50%. Moreover, using an insulative material reduces the overall weight of the cooling element compared to using a conductive metal.

Using a material that can be molded makes it extremely simple to form all of the complex shapes needed to implement the functions of the cooling element according to the invention, for example the bosses 58. What is more, all of those functions can be provided by a single component.

Assembling two half-bodies together to form the cooling element according to the invention guarantees easy molding, especially if the half-bodies are identical.

The use of power modules fixed directly to the openings of the cooling element procures direct contact between the power module and the heat-exchange fluid so that it is possible to use a smaller volume of silicon than is used in the prior art, which represents an economic saving of approximately 30% for each power module.

Fixing two adjacent power modules by means of a common clamp enables the number of fixing members used to be significantly reduced compared to the prior art. Moreover, the two adjacent modules are at the same potential if the common clamp is made from a conductive material. Because a smaller number of fixing members is used, it is possible to employ a greater number of power modules than in the prior art without increasing assembly costs, with the result that the resulting inverter phase is more modular and more compact than those of the prior art. The reduction in the number of fixing members employed is particularly important when, in the case of a cooling element made from two half-bodies, the same fixing members not only fasten the two half-bodies together but also fix each clamp to the respective half-body.

The power modules can equally be fixed to at least one plate attached at one or more of the openings in the cooling element. For example, it is possible to use a single conductive plate to which different power modules are attached, and are therefore at the same potential, enabling the use of standard power modules. It is equally possible to use a plurality of insulative plates to each of which a corresponding power module is fixed, enabling the various modules to be insulated from each other.

The use of one or more such plates enables the use of prior art fixing means in combination with the benefits of an electrically insulative material cooling element.

What is claimed is:

1. A power electronic device, comprising a cooling element (2), a plurality of power modules (38) fixed to said cooling element and starters (40), said cooling element (2) being made from an electrically insulative material and comprising heat-exchange fluid inlet and outlet means (29), an interior volume (V) in which said fluid circulates, and at least one opening (28) connecting said internal volume (V) to the exterior of said element, a perimeter (24) of each opening (28) forming a seat receiving a base (38A) of each power module (38); the device wherein the power modules (38) are fixed in pairs at corresponding openings (28) disposed symmetrically with respect to the median plane (P) of the cooling element (2).

2. A power electronic device according to claim 1, wherein an insert (46) is immobilized between the adjacent ends of the facing modules (38) of each pair.

3. A power electronic device according to claim 1, wherein the end (144) of a first module (138) extends towards a second module (138') facing it at or beyond the end (144') of the latter.

4. A power electronic device according to claim 1, wherein each base (38A) received on the perimeter (24) of each opening (28) is integral with one of said power modules (38).

5. A power electronic device according to claim 4, wherein said base (38A) has fins (44) extending in the fluid flow direction.

6. A power electronic device according to claim 1, wherein said power modules (38) are fixed to said cooling element by a clamp (48) on their face opposite the interior fluid circulation volume (V).

7. The electronic device according to claim 6, wherein said clamp (48) is electrically conductive and is common to two power modules (38) which are adjacent in the fluid flow direction.

8. An electronic device according to claim 6, wherein said cooling element (2) comprises two half-bodies (2A, 2B) assembled together and said clamp member (48) is fixed to said cooling element (2) by fixing means (9) which also fasten said two half-bodies (2A, 2B) together.

9. A power electronic device according to claim 1, wherein the cooling element (2) is made from a material that can be molded.

10. A power electronic device according to claim 1, wherein the cooling element (2)comprises two identical half-bodies (2A, 2B) assembled together.

11. A power electronic device according to claim 1, wherein the intermediate space between two openings (28) which are adjacent in the fluid flow direction includes at least two passages (30) extending in the fluid flow direction and separated by at least one rib (32) on said cooling element (2).

12. A power electronic device according to claim 11, wherein the longitudinal axis of said rib (32) is inclined to the fluid flow direction.

* * * * *